Feb. 28, 1967 KYOICHI FUJIKAWA ETAL 3,307,088

SILVER-LEAD ALLOY CONTACTS CONTAINING DOPANTS FOR SEMICONDUCTORS

Filed March 13, 1963

United States Patent Office 3,307,088

Patented Feb. 28, 1967

3,307,088

SILVER-LEAD ALLOY CONTACTS CONTAINING DOPANTS FOR SEMICONDUCTORS

Kyoichi Fujikawa, 35–23 Kitayama; Tokuzo Sukegawa, 12 Otamayashita; and Jun-Ichi Nishizawa, 56 Komegafukuro-Nakacho, all of Sendai-shi, Japan Filed Mar. 13, 1963, Ser. No. 265,591
Claims priority, application Japan, Mar. 13, 1962, 37/9,743
8 Claims. (Cl. 317—234)

Figure 1:
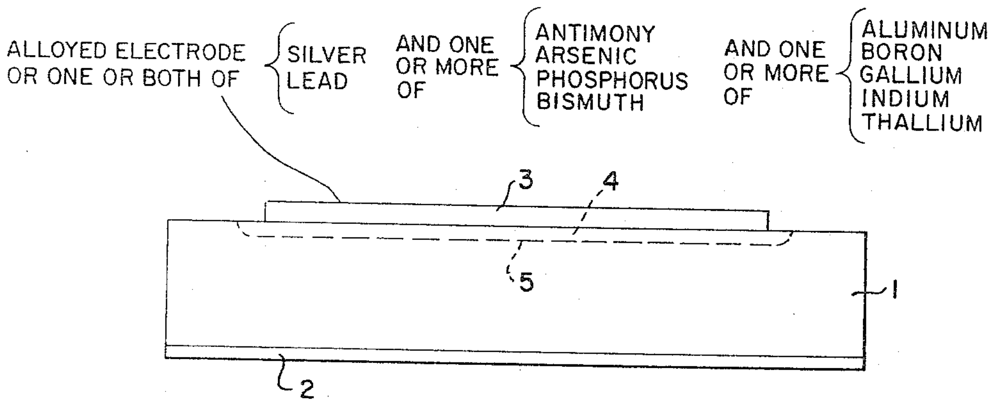

Our invention relates to diodes, transistors and other electronic semiconductor devices having a crystalline body of silicon with one or more p-n junctions.

For high-frequency use of such devices it is desirable that the dopant density be greatest at the p-n junction and decreases gradually with increasing distance therefrom. In practice, however, drift transistors, drift diodes, voltage-responsive variable capacitor diodes and various other semiconductor junction devices have heretofore not been reliably reproducible in this manner by large-scale manufacture. It is also necessary to provide for qualitative uniformity from product to product as regards dopant distribution in the neighborhood of junction regions, and to afford sufficient control of the manufacturing procedure by changing the duration and temperature of the heat treatment for obtaining prescribed qualitative data of the electrical properties.

The processes heretofore used in the manufacture of silicon semiconductor devices for obtaining the above-mentioned distribution of dopant impurities in the silicon crystal involve applying an alloying method after preceding diffusion treatment. The results leave much to be desired as regards uniformity of alloy distribution, so that the electrical characteristics obtained fail to satisfactorily approach theoretically attainable values.

It is an object of our invention, to improve diodes, transistors and other p-n junction silicon devices, particularly for high-frequency use, as regards one or more of such electrical properties as gain, band width, and response of capacitance to changes in applied voltage. In this respect, it is another, more specific object to provide an improved silicon diode of variable capacitance for parametric amplification, frequency modulation and other purposes.

One method comprises the steps of placing on the silicon body a dominantly donor doped metal containing at least one of the metals silver and lead, and at least one of aluminum, boron, gallium, indium and thallium in a quantity smaller than the donor contents, and alloying to produce the p-n junction in the silicon body, the dopant concentration is the p-side decreasing with increasing distance from the junction.

According to our invention, however, we can obtain diffusion simultaneously with the alloying process, since we use the metallic alloying material, which contains at least one of the metals silver and lead, with a small amount of at least one of aluminum, boron, gallium, indium, and thallium in addition to at least one of the donor impurities, antimony, arsenic, phosphorous and bismuth.

Another method comprises the steps of placing on the silicon body an electrode formed of at least one metal from the group consisting of silver and lead and containing a donor impurity of phosphorus, said material also containing at least one acceptor substance from the group consisting of indium and thallium in a quantity larger than that of said donor impurity, and alloying to produce the p-n junction in the silicon body, the dopant concentration in the n-side decreasing with increasing distance from the junction.

Figure 2:
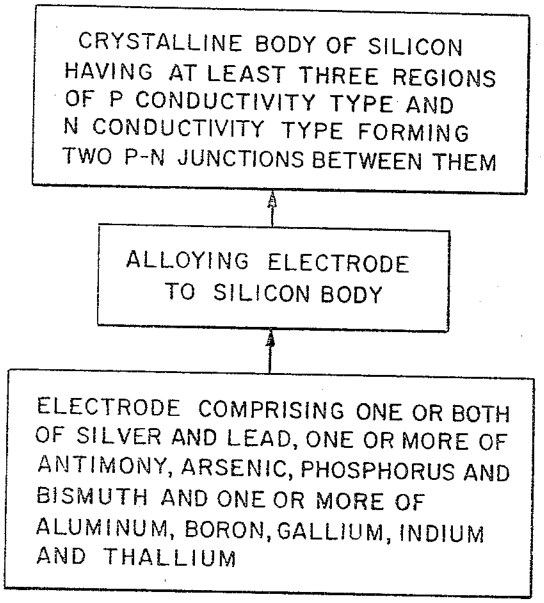

In order that the present invention may be readily carried into effect, it will now be described with reference to the accompanying drawing, wherein:

FIG. 1 is a view of an embodiment of a diode made in accordance with the method of the present invention; and FIG. 2 is a flow diagram of the method of the present invention.

A circular disc 1 of monocrystalline p-type silicon is alloyed together with an ohmic contact electrode 2 of silver or aluminum and carries on the opposite side an alloyed electrode 3 produced from a metal foil of silver or lead, or both silver and lead, which contains, as donor impurity, one or more of antimony, arsenic, phosphorus and bismuth and also contains at least one of aluminum, boron, gallium, indium and thallium in a quantity smaller than that of the donor impurity. Due to the alloying and conjoint diffusion process, donor and acceptor impurity migrate into an n-region 4 of the silicon body 1, thus forming a p-n junction 5.

In general, the amount of acceptor substance, namely at least one of aluminum, boron, gallium, indium and thallium, admixed with the donor-doped material, is 0.0001 to 10 weight percent of the entire composition having a donor content of 0.1 to 80 weight percent of one or more of Sb, As, Bi; the remainder may contain Pb or Ag or both in an amount of 20 to 99 percent by weight of the whole.

The amount of acceptor substance, namely at least one of aluminum and gallium, admixed with the donor-doped material, is 0.0001 to 10 weight percent of the entire composition having a donor content of 0.1 to 80 weight percent of phosphorus. The remainder may contain Pb or Ag or both in an amount of 20 to 99 weight percent of the whole.

The amount of acceptor substance, namely at least one of indium and thallium admixed with the donor-doped material is 10 to 95 weight percent of entire composition having a donor content of 0.001 to 1 weight percent of phosphorus. The remainder may contain Pb or Ag or both in an amount of 5 to 90 weight percent of the whole.

The abovementioned alloy materials are placed upon the silicon crystal and both are heated and alloyed at 500 to 1300° C.

For example, aluminum is an acceptor in silicon and has especially a larger diffusion coefficient in silicon than the above-mentioned donor impurities. For both reasons, the admixture of aluminum to the donor-doped electrode metal seems adverse to the intended purpose of forming a p-n junction. However, we apply aluminum in a small quantity, to the donor impurity, the quantity of the latter being chosen in the known manner in accordance with the desired dopant concentration in the n-type region.

The improved properties obtained by virtue of the invention can be explained as follows. During the alloying process mentioned above, the high diffusion coefficient of aluminum causes it to diffuse into the silicon as though aluminum were being diffused individually. Thus, the penetration of aluminum into the silicon precedes the advance of the alloying front proper and produces or enhances a p-type diffusion region. Simultaneously, the advancing production of an alloy with at least one of antimony, arsenic or phosphorus and bismuth finally results in converting the region into an alloyed layer of n-type.

As a result, the aluminum distribution is such that the dopant concentration is greatest at the p-n junction area and gradually decreases as the distance from it increases. Conjointly, because the migration by diffusion started from the alloying surface or front, an equal distribution over the entire extent of the front, that is in a direction parallel thereto, is obtained, which also contributes to the beneficial results observed. The fact that the alloying metal contains a relatively large quantity of silver, lead or both makes it possible to immediately attach a wire or other conductor to the metal after cooling. This advantage is not obtainable if an alloying metal is utilized which consists entirely of the above-mentioned donor dopants, aside from the very slight aluminum addition, since said donor dopants do not readily lend themselves to the attachment of other conductors.

The advantages achieved by virtue of the invention will be understood from the following.

A semiconductor variable capacitor consists of a diode whose capacitance can be varied by applying variable voltage, for such purposes as parametric amplification, automatic frequency control, or frequency modulation, and whose gain and band width depend the largest feasible value of the term $dC/dV/C$ in which C denotes capacitance and V denotes voltage. The value of this term in the variable-capacitor diodes heretofore available was limited to a range of about $-(2V)^{-1}$ to $-(3V)^{-1}$ because the capacitance-voltage relationship was in the range of $C \alpha V^{-1/2}$ to $C \alpha V^{-1/3}$.

However, a semiconductor variable capacitor made according to the invention permits obtaining several times up to several ten times the above-mentioned $dC/dV/C$ value. This can be explained by the fact that the distribution of dopant atoms in the semiconductor crystal has been made abruptly decreasing toward the direction from the p-n junction to the electrode.

When aluminum is used as the p-type impurity and antimony as the n-type impurity, the electrode material preferably consists of 0.01–5% by weight of aluminum, 1–50% antimony, and 5–95% lead and silver. The material is placed upon silicon crystal and both are heated at 800–1200° C. during 1–300 minutes. As a typical example, 43.8% silver, 35.8% lead, 20% antimony and 0.4% aluminum are mixed and alloyed with the silicon body at 950° C. for about 30 minutes.

For example, silicon diodes were made in the manner described above by placing a circular electrode foil of 0.1 mm. thickness and 1 mm. diameter upon the silicon crystals of somewhat less than 0.5 mm. thickness and 0.7 to 2.00 mm. diameter. Both were heated, under the proper pressure for holding them in contact and the assembly was then permitted to cool. The junction capacitance of the diode was measured at different voltages. At 3 volts, the capacitance was found to be about one-tenth of the value measured at 0 volt. The breakdown voltage was approximately 30 volts.

Substantially the same results were obtained with a silicon diode prepared with an electrode of 27.9 weight percent silver, 55.8% lead, 16% antimony and 0.3% aluminum.

Our invention, of course, is not limited to the particular device illustrated herein and described above but is applicable to several types of p-n junction devices with one or several junctions, as well as for various other uses in which either the improvement in gain, band width or variable capacitance ratio is utilized.

In principle, our invention is also applicable to germanium semiconductor devices. In the case of silicon devices, however, the alloy formation is more uniform and the device becomes applicable for manufacture and use at high temperatures.

We claim:

1. The method of producing an electronic semiconductor device having a crystalline body of silicon having an n-conductivity type region and a p-conductivity type region forming a p-n junction between them in said body, said method comprising the steps of joining with the silicon body an electrode containing silver and lead and containing at least one donor impurity from the group consisting of antimony, phosphorus, arsenic and bismuth, said electrode also containing at least one substance from the group consisting of aluminum, boron, gallium, indium and thallium; and alloying the electrode with the silicon body to produce in said silicon body a region forming a p-n junction in said silicon body and having a dopant concentration decreasing with increasing distance from said p-n junction.

2. The method of producing an electronic semiconductor device having a crystalline body of silicon having a p-conductivity type region and an n-conductivity type region forming a p-n junction between them in said body, said method comprising the steps of joining with the silicon body a metal electrode member containing 0.0001 to 10 percent by weight of at least one substance from the group consisting of aluminum, boron, gallium, indium and thallium, containing 0.1 to 80 percent by weight of at least one donor substance from the group consisting of antimony, arsenic and bismuth, and containing silver and lead; and alloying the electrode with the silicon body to produce in said silicon body a p-conductivity type region forming a p-n junction in said silicon body and having the dopant concentration in the p-conductivity type region decreasing with increasing distance from said p-n junction.

3. The method of producing an electronic semiconductor device having a crystalline body of silicon having a p-conductivity type region and an n-conductivity type region forming a p-n junction between them in said body, said method comprising the steps of joining with the silicon body a metal electrode member containing 0.0001 to 10 percent by weight of at least one substance from the group consisting of aluminum and gallium, containing 0.1 to 80 percent by weight of donor substance of phosphorous, and containing silver and lead; and alloying the electrode with the silicon body to produce in said silicon body a p-conductivity type region forming a p-n junction in said silicon body and having the dopant concentration in the p-conductivity type region decreasing with increasing distance from the said p-n junction.

4. The method of producing an electronic semiconductor device having a crystalline body of silicon having a p-conductivity type region and an n-conductivity type region forming a p-n junction between them in said body, said method comprising the steps of joining with the silicon body a metal electrode member containing 10 to 95 percent by weight of at least one substance from the group consisting of indium and thallium, containing 0.001 to 1 percent by weight of donor substance of phosphorous, and containing silver and lead; and alloying the electrode with the silicon body to produce in said silicon body an n-conductivity type region forming a p-n junction in said silicon body and having the dopant concentration in the n-conductivity type region decreasing with increasing distance from said p-n junction.

5. An electronic semiconductor device for high frequency use, comprising a crystalline body of silicon having a p-conductivity type region and an n-conductivity type region forming a p-n junction between them in said body; an electrode joined to said n-conductivity type region, said electrode comprising silver and lead, at least one donor impurity from the group consisting of antimony, arsenic and bismuth, and at least one acceptor substance from the group consisting of aluminum, boron, gallium, indium and thallium in a quantity smaller than that of said donor impurity, said n-conductivity type region containing donor impurity and acceptor substance from the electrode in diffused distribution and having a dopant concentration decreasing with increasing distance from said p-n junction.

6. An electronic semiconductor device for high frequency use, comprising a crystalline body of silicon having a p-conductivity type region and an n-conductivity type region forming a p-n junction between them in said body; an electrode joined to said n-conductivity type region, said electrode comprising silver and lead, a donor impurity of phosphorous, and at least one acceptor substance from the group consisting of aluminum and gallium in a quantity smaller than that of said donor impurity, said n-conductivity type region containing donor impurity and acceptor substance from the electrode in diffused distribution and having a dopant concentration decreasing with increasing distance from said p-n junction.

7. An electronic semiconductor device for high frequency use, comprising a crystalline body of silicon having a p-conductivity type region and an n-conductivity type region forming a p-n junction between them in said body; an electrode joined to said p-conductivity type region, said electrode comprising silver and lead, a donor impurity of phosphorous, and at least one acceptor substance from the group consisting of indium and thallium in a quantity larger than that of said donor impurity, said p-conductivity type region containing donor impurity and acceptor substance from the electrode in diffused distribution and having a dopant concentration decreasing with increasing distance from said p-n junction.

8. The method of producing an electronic semiconductor device having a crystalline body of silicon having at least three regions of p-conductivity type and n-conductivity type forming two p-n junctions between them in said body, said method comprising the steps of joining with a n-conductivity type or p-conductivity type region of the silicon body an electrode comprising silver or lead, at least one donor impurity from the group consisting of antimony, phosphorous, arsenic and bismuth, and at least one acceptor impurity from the group consisting of aluminum, boron, gallium, indium and thallium; and alloying the electrode with the silicon body to produce in said silicon body p-conductivity type and n-conductivity type regions forming two p-n junctions between them.

References Cited by the Examiner

UNITED STATES PATENTS

| | | | |
|---|---|---|---|
| 2,763,822 | 9/1956 | Frola et al. | 317—234 |
| 2,793,145 | 5/1957 | Clarke | 317—235 |
| 2,820,932 | 1/1958 | Looney | 317—240 |
| 2,836,521 | 5/1958 | Longini | 317—235 X |
| 2,840,497 | 6/1958 | Longini | 317—235 |
| 2,861,018 | 11/1958 | Fuller et al. | 317—235 X |
| 2,883,313 | 4/1959 | Pankove | 317—235 X |
| 2,943,006 | 6/1960 | Henkels | 317—235 |
| 3,029,170 | 4/1962 | Lamming | 317—235 X |
| 3,074,826 | 1/1963 | Tummers | 317—235 X |
| 3,078,195 | 2/1963 | Tummers et al. | 148—33 |
| 3,078,397 | 2/1963 | Tummers et al. | 317—235 X |
| 3,199,004 | 8/1965 | Dickson | 317—240 |

JOHN H. HUCKERT, *Primary Examiner.*

JAMES D. KALLAM, *Examiner.*

C. E. PUGH, R. SANDLER, *Assistant Examiners.*